(12) United States Patent
Cho et al.

(10) Patent No.: US 9,356,618 B2
(45) Date of Patent: May 31, 2016

(54) SECOND ORDER LOOP FILTER AND MULTI-ORDER DELTA SIGMA MODULATOR INCLUDING THE SAME

(71) Applicant: Electronics and Telecommunications Research Institute, Daejeon (KR)

(72) Inventors: Young Kyun Cho, Daejeon (KR); Jae Ho Jung, Daejeon (KR); Kwangchun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/617,705

(22) Filed: Feb. 9, 2015

(65) Prior Publication Data
US 2015/0229292 A1    Aug. 13, 2015

(30) Foreign Application Priority Data

Feb. 12, 2014   (KR) .................. 10-2014-0015799

(51) Int. Cl.
*H03M 3/00* (2006.01)
*H03H 11/12* (2006.01)
*H03H 11/32* (2006.01)

(52) U.S. Cl.
CPC .............. *H03M 3/43* (2013.01); *H03H 11/126* (2013.01); *H03H 11/1247* (2013.01);
(Continued)

(58) Field of Classification Search
CPC ......... H03M 3/43; H03M 3/424; H03M 3/30; H03M 3/456; H03M 3/482; H03M 3/49; H03H 11/1247; H03H 11/126; H03H 11/32; H03H 11/0427
USPC .......................................... 341/143, 155, 120
See application file for complete search history.

(56) References Cited

U.S. PATENT DOCUMENTS

| | | | |
|---|---|---|---|
| 5,243,345 A | 9/1993 | Naus et al. | |
| 6,639,946 B2 * | 10/2003 | Wu | H04B 14/06 341/143 |

(Continued)

FOREIGN PATENT DOCUMENTS

| | | |
|---|---|---|
| KR | 10-2006-0129544 A | 12/2006 |
| WO | WO 2005/099098 A1 | 10/2005 |

OTHER PUBLICATIONS

Zanbaghi, R., et al., "A Novel Low Power Hybrid Loop Filter for Continuous-Time Sigma-Delta Modulators", Proceedings from the IEEE International Symposium on Circuits and Systems, (ISCAS '09), held at Taipei, May 24-27, 2009, pp. 3114-3117.

(Continued)

*Primary Examiner* — Jean B Jeanglaude
(74) *Attorney, Agent, or Firm* — NSIP Law (57) ABSTRACT

Provided is a second order loop filter (LF). The second order LF includes: an operational amplifier including a first input, a second input receiving a differential input of the first input, and an output; an inverter inverting a signal output from the output of the operational amplifier to output an inverted signal; a first resistor connected to between the first input and a first node; a second resistor connected to between the output of the operational amplifier and the first node; a third resistor connected to between the first input and an input signal; a first capacitor connected to between the second input and the first node; a second capacitor connected to between the output of the operational amplifier and an output of the inverter; and a third capacitor connected to between the output and the first input of the operational amplifier, wherein the second input is connected to a ground voltage.

15 Claims, 10 Drawing Sheets (52) U.S. Cl.
CPC ........... *H03H 11/1291* (2013.01); *H03M 3/38* (2013.01); *H03H 11/32* (2013.01); *H03M 3/422* (2013.01); *H03M 3/454* (2013.01); *H03M 3/458* (2013.01)

(56) References Cited

U.S. PATENT DOCUMENTS

| | | | | |
|---|---|---|---|---|
| 7,439,889 | B2* | 10/2008 | Fujimoto | H03M 1/0836 341/120 |
| 7,545,301 | B2 | 6/2009 | Kim et al. | |
| 7,928,878 | B1* | 4/2011 | Coban | H03M 3/344 341/143 |
| 8,258,990 | B2 | 9/2012 | Dosho et al. | |
| 8,779,831 | B2* | 7/2014 | Putter | G06G 7/18 327/336 |
| 2012/0212288 | A1* | 8/2012 | Masui | H03H 11/0427 327/557 |

OTHER PUBLICATIONS

Prefasi, E., et al., "A 0.1 mm², Wide Bandwidth Continuous-Time ΣΔ ADC Based on a Time Encoding Quantizer in 0.13 μm CMOS", IEEE Journal of Solid-State Circuits, vol. 44, No. 10, Oct. 2009, pp. 2745-2754.

Matsukawa, K., et al., "A Fifth-Order Continuous-Time Delta-Sigma Modulator With Single-Opamp Resonator", IEEE Journal of Solid-State Circuits, vol. 45, No. 4, Apr. 2010, pp. 697-706.

Zanbaghi, R., et al., "An 80-dB DR, 7.2-MHz Bandwidth Single Opamp Biquad Based CT ΔΣ Modulator Dissipating 13.7-mW", IEEE Journal of Solid-State Circuits, vol. 48, No. 2, Feb. 2013, pp. 487-501.

Jain, A., et al. "Analysis and Design of a High Speed Continuous-time ΔΣ Modulator Using the Assisted Opamp Technique", IEEE Journal of Solid-State Circuits, vol. 47, No. 7, Jul. 2012, pp. 1615-1625.

* cited by examiner

SECOND ORDER LOOP FILTER AND MULTI-ORDER DELTA SIGMA MODULATOR INCLUDING THE SAME

CROSS-REFERENCE TO RELATED APPLICATIONS

This U.S. non-provisional patent application claims priority under 35 U.S.C. §119 of Korean Patent Application No. 10-2014-0015799, filed on Feb. 12, 2014, the entire contents of which are hereby incorporated by reference.

BACKGROUND OF THE INVENTION

A continuous time delta-sigma modulator has advantages such as anti-aliasing and high signal to noise ratio (SNR) characteristics. Due to such characteristics, the continuous time delta-sigma modulator is widely used in a wireless communication system such as 3rd generation partnership project (3GPP), long term evolution (LTE) or worldwide interoperability for microwave access (WIMAX).

With the recent enhancement in a semiconductor manufacturing technology, various researches on a delta-sigma modulator that reduces power consumption are being conducted. As an example, a multi-order delta-sigma modulator decreasing the power consumption of the entire circuit by using a multi-order loop filter (LF) is being provided, unlike a typical configuration in which an integrator increases as the order of the delta-signal modulator increases. In order for the multi-order LF to normally operate, the transfer function (TF) of the multi-order LF should satisfy a specific condition. In order to satisfy such a condition, there is a need to control the characteristics of elements (e.g., resistance or capacitance) in the multi-order LF. However, since the characteristics of the elements vary due to a process, voltage, and temperature (PVT) variation in a manufacturing process, there is a limitation in controlling the characteristics of elements in order to satisfy the operational condition of the multi-order LF. In order to satisfy the operational condition of the multi-order LF, the control range of the characteristics of the elements may also increase.

SUMMARY OF THE INVENTION

The present invention relates to a signal modulator, more particularly, relates to a 2nd order loop filter and a multi-order delta sigma modulator including the same. According to exemplary embodiments of the present invention, the present invention provides a multi-order loop filter reducing power consumption and having a reduced element control range.

Embodiments of the present invention provide second order loop filters (LF) including: an operational amplifier including a first input, a second input receiving a differential input of the first input, and an output; an inverter inverting a signal output from the output of the operational amplifier to output an inverted signal; a first resistor connected to between the first input and a first node; a second resistor connected to between the output of the operational amplifier and the first node; a third resistor connected to between the first input and an input signal; a first capacitor connected to between the second input and the first node; a second capacitor connected to between the output of the operational amplifier and an output of the inverter; and a third capacitor connected to between the output and the first input of the operational amplifier, wherein the second input is connected to a ground voltage.

In some embodiments, the first to third capacitors may be variable capacitors or the first to third resistors may be variable resistors.

In other embodiments, the second order loop filters (LF) may further include a fourth resistor connected in parallel to the first capacitor.

In still other embodiments, capacitance values of the first to third capacitors may be adjusted to enable the second order LF to perform a low pass filter operation.

In even other embodiments, the second or third capacitor may be adjusted to enable a first order term of a denominator of a transfer function (TF) of the second order LF to be zero.

In yet other embodiments, the operational amplifier may be an operational transconductance amplifier (OTA).

In further embodiments, a parasitic capacitance generated at the first node may be adjusted by the first capacitor.

In other embodiments of the present invention, second order loop filters (LF) include: an operational amplifier including a first input, a second input, a first output and a second output; a first resistor connected to between the first input and a first node; a second resistor connected to between the first output and the first node; a third resistor connected to between the first input and a first input signal; a fourth resistor connected to between the second input and a second node; a fifth resistor connected to between the second output and the second node; a sixth resistor connected to between the second input and a second input signal; a first capacitor connected to between the first node and the second node; a second capacitor connected to between the second output and the first node; a third capacitor connected to between the first input and the first output; a fourth capacitor connected to between the first output and the second node; and a fifth capacitor connected to between the second input and the second output, wherein the first and second inputs are differential inputs, the first and second outputs are differential outputs, and the first and second input signals are differential input signals.

In some embodiments, the first to fifth capacitors may be variable capacitors or the first to sixth resistors may be variable resistors.

In other embodiments, the second order loop filters (LF) may further include a seventh resistor connected in parallel to the first capacitor.

In still other embodiments of the present invention, multi-order delta-sigma modulators (DSM) include: a second order LF integrating a difference between an input signal and an analog signal to output an integrated signal; a quantizer quantizing a signal output from the second order LF to output an output signal; and a digital to analog converter (DAC) converting a signal output from the quantizer into an analog signal to output the analog signal, wherein the second order LF includes: an operational amplifier including a first input, a second input receiving a differential input of the first input, and an output; an inverter inverting a signal output from the output of the operational amplifier to output an inverted signal; a first resistor connected to between the first input and a first node; a second resistor connected to between the output of the operational amplifier and the first node; a third resistor connected to between the first input and an input signal; a first capacitor connected to between the second input and the first node; a second capacitor connected to between the output of the operational amplifier and an output of the inverter; and a third capacitor connected to between the output and the first input of the operational amplifier, wherein the second input is connected to a ground voltage.

In some embodiments, the first to third capacitors may be variable capacitors or the first to third resistors may be variable resistors.

In other embodiments, the multi-order delta-sigma modulators (DSM) may further include an integrator provided between the input signal and an input of the second order LF, wherein the integrator integrates a difference between the input signal and the analog signal to transmit an integrated signal to the second order LF.

In still other embodiments, the multi-order delta-sigma modulators (DSM) may further include n LFs (where n is a natural number larger than zero), wherein the n LFs and the second order LF may be serially connected, and the multi-order DSM may quantize a signal finally output from the n LFs and the second order LF that are serially connected, and output the output signal.

In even other embodiments, a size of a noise transfer function (NFT) of the multi order DSM may increase step by step, as a size of the n increases.

BRIEF DESCRIPTION OF THE DRAWINGS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
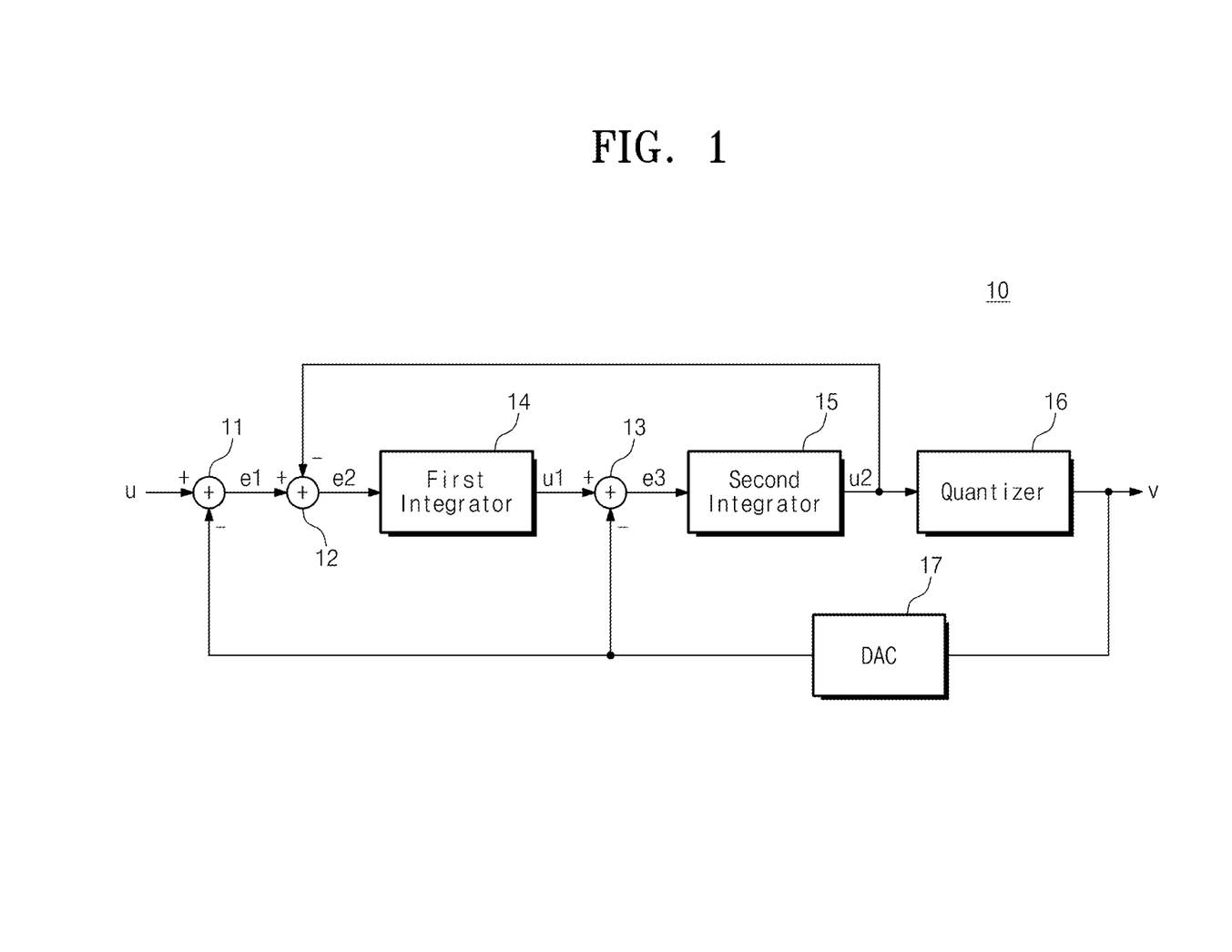
FIG. 1 is a block diagram of a second order delta-sigma modulator (DSM)
Figure 2:
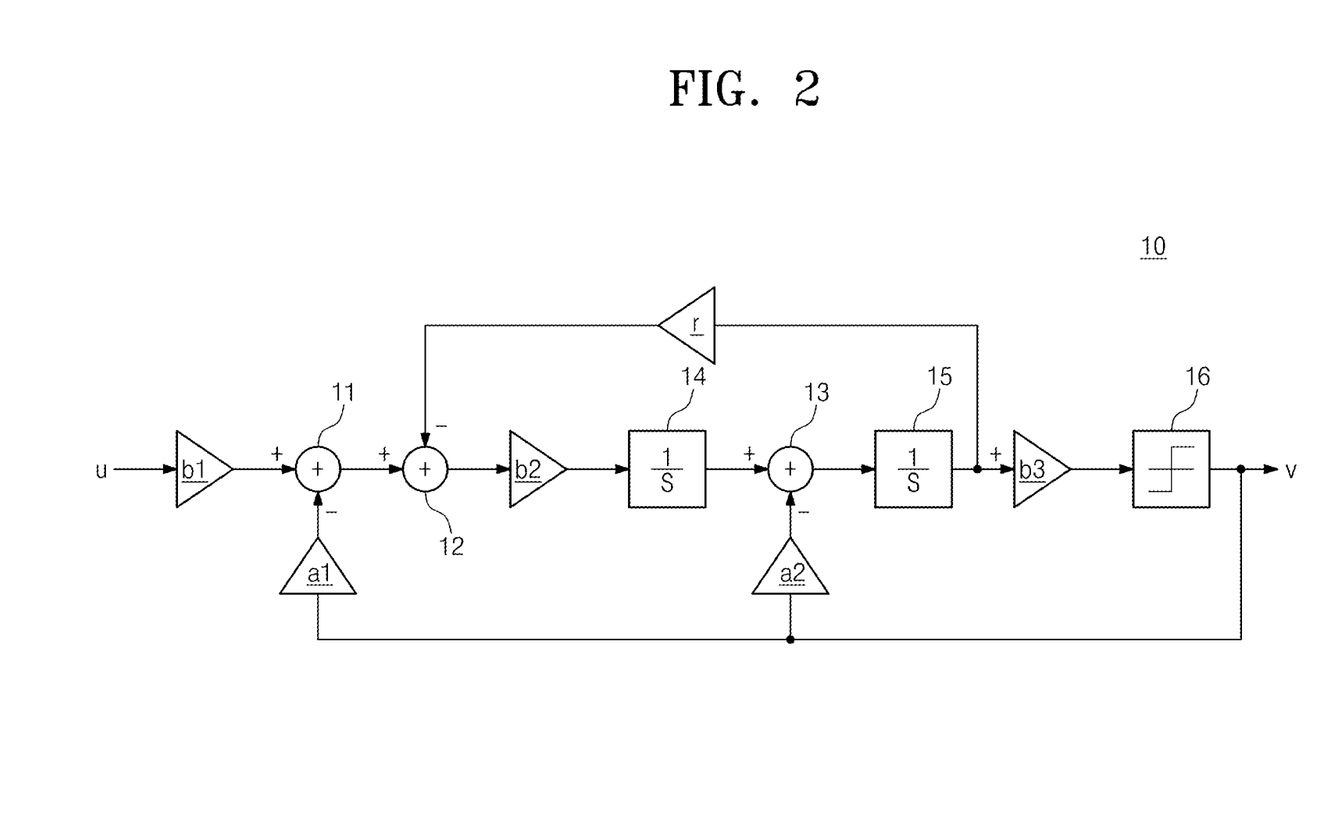
FIG. 2 is a block diagram showing the signal flow of the second order DSM in FIG. 1.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein FIG. 1 is a block diagram of a second order delta-sigma modulator (DSM). FIG. 2 is a block diagram showing the signal flow of the second order DSM in FIG. 1. Referring to FIGS. 1 and 2, the second order DSM 10 includes first to third adders 11 to 13, first and second integrators 14 and 15, a quantizer 16, and a digital to analog converter (DAC) 17.

The first adder 11 may output the difference e1 between an input signal u and the output signal of the DAC 17. The second adder 12 may output the difference e2 between the signal difference e1 and the output signal of the second integrator 15. The first integrator 14 may integrate the signal difference e2 to output a signal u1. The third adder 13 may output the difference e3 between the output signal of the DAC 17 and an integrated signal u1. The second integrator 15 may integrate the signal difference e3 to output a signal u2. The quantizer 16 may compare an integrated signal u2 with a reference value to output an output signal v. The DAC 17 may convert the output signal v into an analog signal.

As an example, gains a1 and a2 may indicate the signal gains of signals output from the DAC 17. A gain b1 indicates the signal gain of the input signal u, a gain b2 indicates the signal gain of the first integrator 14, a gain b3 indicates the signal gain of the quantizer 16, and a gain r indicates the signal gain of a feedback loop.

As an example, the quantizer 16 may be a 1-bit quantizer. A certain direct current (DC) voltage may be applied as the input signal u. When the DC voltage is lower than a reference value, the voltage of the output signal u2 of the second integrator 15 decreases to a certain value. In this case, the output signal v output by the quantizer 16 includes more logic low signals than logic high signals. On the contrary, when the DC voltage is higher than the reference value, the voltage of the output signal v of the second integrator 15 increases to a certain value. In this case, the output signal v output by the quantizer 16 includes more logic high signals than logic low signals. That is, the second order DSM 10 integrates and quantizes the difference between the output signal v and the input signal u to be capable of minimizing quantizing noise, the difference between the input signal u and the output signal v.

As shown in FIGS. 1 and 2, the second order DSM 10 is used for two integrators 14 and 15. A general integrator includes an amplifier, resistor and capacitor. A plurality of integrators is components that consume maximum power, among the components of the second order DSM. Since the number of the integrators increases with an increase in the order of the DSM, there are limitations in that the configuration of a circuit is complex and power consumption increases.

Figure 3:
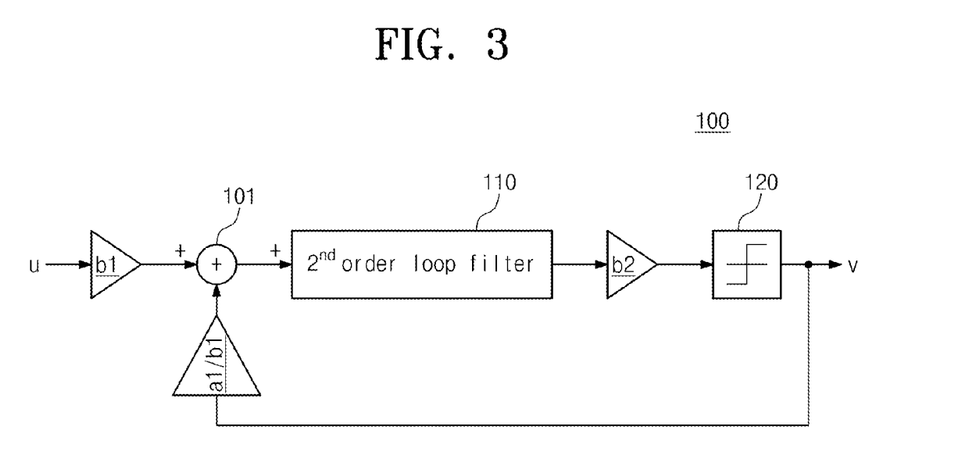
FIG. 3 is a block diagram showing a second order DSM according to an embodiment of the present invention.

FIG. 3 is a block diagram showing a second order DSM according to an embodiment of the present invention. Referring to FIG. 3, the second DSM 100 includes a second order loop filter (LF) 110, an adder 101, and a quantizer 120. As an example, components (e.g., DAC) unnecessary for describing a transfer function (TF) of the second DSM are omitted.

The second order LF 110 may integrate the difference between the input signal u and the output signal v to transmit an integrated signal to the quantizer 120. That is, the second order LF 110 may perform the functions of the first and second integrators 14 and 15 in FIGS. 1 and 2. As an example, the TF of the second order LF 110 may be obtained by performing coefficient conversion on the block diagram in FIG. 2. As an example, the TF of the second order LF 110 may be represented by Equation (1):

$$H(s) = \frac{b_1 b_3 a_1 s + b_1 b_2 b_3}{s^2 + r b_2} \quad (1)$$

Referring to Equation 1, H(s) denotes the TF of the second order LF 110, a1 the signal gain of the DAC (not shown), b1 to b3 the respective signal gains of the input signal u, the first integrator 14, and the quantizer 16, and s a complex frequency. As an example, the TF of the second order LF 110 may have the same structure as that of a low pass filter, as represented in Equation 1.

Figure 4:
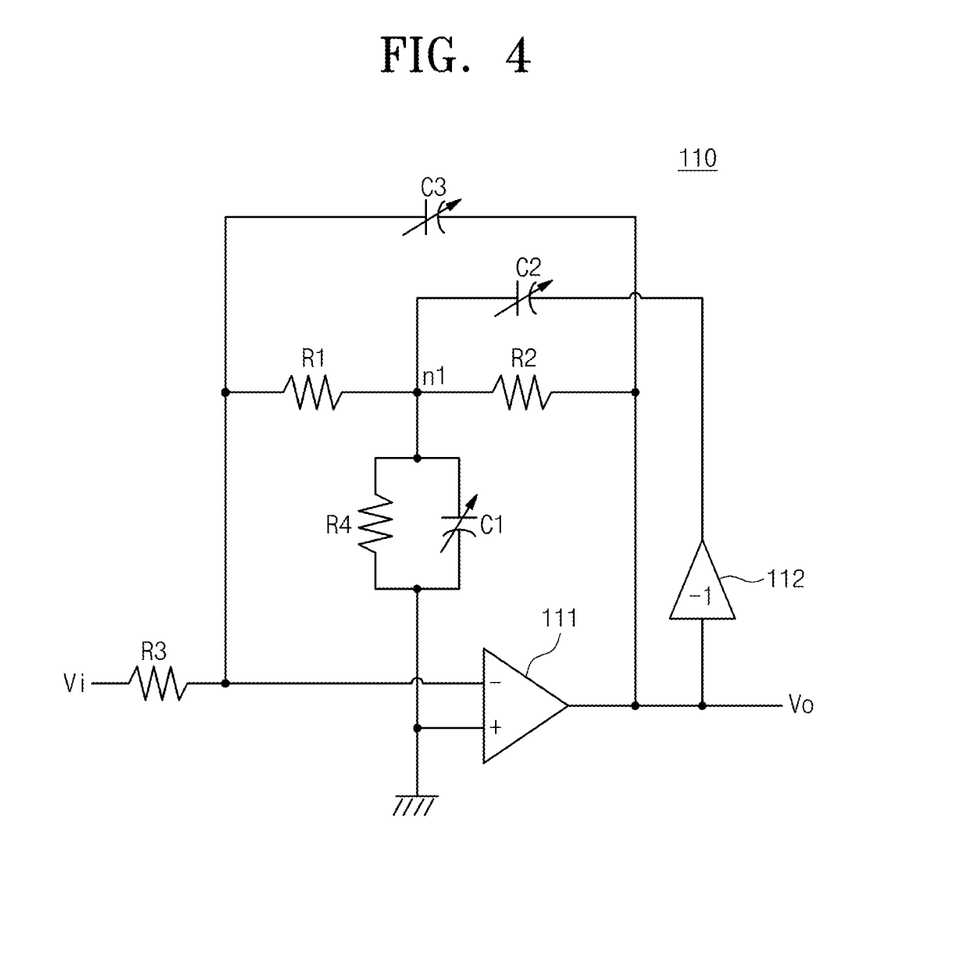
FIG. 4 is a detailed circuit diagram of a second order loop filter (LF) in FIG. 3.

FIG. 4 is a detailed circuit diagram of the second order LF in FIG. 3. Referring to FIG. 4, the second order LF 110 includes first to fourth resistors R1 to R4, first to third capacitors C1 to C3, an operational amplifier 111, and an inverter 112. As an example, the operational amplifier 111 may be an operational transconductance amplifier (OTA).

One end of the first resistor R1 is connected to a first node n1, and the other end thereof is connected to a first input of OTA 111. One end of the third resistor R3 receives an input voltage Vi and the other end thereof is connected to a first input of the OTA 111. One end of the second resistor R2 is connected to the first node n1, and the other end thereof is connected to an output of the OTA 111. One end of the fourth resistor R4 is connected to the first node n1, and the other end thereof is connected to a second input of the OTA 111.

One end of the first capacitor C1 is connected to the second input of the OTA 111 and the other end thereof is connected to the first node n1. One end of the second capacitor is connected to the first node n1, and the other end thereof is connected to the output of the inverter 112. One end of the third capacitor C3 is connected to the first input of the OTA 111 and the other end thereof is connected to the output of the OTA 111. As an example, the second input of the OTA 111 may be a virtual ground or differential input of the first input. As an example, the input voltage Vi may be an input signal.

The inverter 112 may invert the output signal Vo of the OTA 111 to output an inverted output signal.

The TF of the second order LF 110 in FIG. 4 may be represented by Equation (2):

$$\frac{V_o}{V_i} = \frac{X_1 s + X_2}{Y_1 s^2 + Y_2 s + Y_3} \quad (2)$$

$$\therefore X_1 = C_1 R_1 R_2 R_4 + C_2 R_1 R_2 R_4$$

$$X_2 = R_2 R_4 + R_1 R_2 + R_1 R_4$$

$$Y_1 = C_1 C_3 R_1 R_2 R_3 R_4 + C_2 C_3 R_1 R_2 R_3 R_4$$

$$Y_2 = C_3 R_2 R_3 R_4 + C_3 R_1 R_2 R_3 + C_3 R_1 R_3 R_4 - C_2 R_2 R_3 R_4$$

$$Y_3 = R_3 R_4.$$

Referring to FIG. 2, Vi denotes an input voltage, Vo an output voltage, X1 and X2 the coefficient of the first order term and constant term of the denominator of the TF, Y1 to Y3 the coefficient of the second order term, the coefficient of the first order term, and constant term of the numerator of the TF, C1 to C3 the capacitance values of the first to third capacitors C1 to C3, and R1 to R4 the resistances of the first to fourth resistors R1 to R4.

As represented in Equation 1, the TF of the second order LF 110 has the same configuration as that of the low pass filter. That is, in order for the second order LF 110 in FIG. 4 to normally operate, the TF of the second order LF 110 needs to have the same configuration as the TF H(s) in Equation 1. That is, the first order term of the denominator of the TF of the second order LF 110 in FIG. 4 would be "zero". In this case, the first order term of the denominator of the TF of the second order LF 110 in FIG. 4 may be represented by Equation (3):

$$Y_2 = 0$$

$$C_3(R_2 R_3 R_4 + R_1 R_2 R_3 + R_1 R_3 R_4) = C_2 R_2 R_3 R_4 \quad (3).$$

Since the coefficients in Equation 3 are described with reference to Equation 2, their descriptions are omitted. Referring to Equation 3, the capacitance values of the first to third capacitors C1 to C3 and the resistances of the first to fourth resistors R1 to R4 are set to satisfy Equation 3.

As an example, the first to third capacitors C1 to C3 may be variable capacitors. The first to third capacitors C1 to C3 may be adjusted so that the second order LF 110 satisfies an operational condition. In other words, the first to third capacitors C1 to C3 may be set to satisfy Equation 3. For example, the first and third capacitors C1 and C3 may be controlled to satisfy Equation 3 (or such that the first order term of the denominator of the TF of the second order LF 110 becomes "zero"). As an example, the first to fourth resistors R1 to R4 may be variable resistors. The first to fourth resistors R1 to R4 may be set to satisfy the condition in Equation 3.

As an example, the capacitance connected to the first node n1 of the second order LF 110 may vary by parasitic components generated in layout or operation. It may be corrected by the adjusting of the capacitance value of the first capacitor C1.

According to an embodiment of the present invention as described above, the second order LF 110 may control the two capacitors to satisfy an operational condition. However, a typical second order LF controls a capacitor in order to satisfy an operational condition (e.g., operational condition of a low pass filter). However, the second order LF 110 according to the present invention may decrease the control range of elements for satisfying an operational condition, when compared to a typical multi-order LF. That is, it is possible to perform the same operation as the typical second order LF through element control of a decreased range.

Also, since two integrators are implemented through one LF, a signal delay caused by the integrators decreases to ½. Thus, a configuration compensating for a delayed time in a communication system (specially, envelope pulse width modulation (EPWM) transmitter) may become simple.

Also, since it is possible to operate the second order LF by controlling a plurality of capacitors, control over a change in characteristics of noise TF (NTF) and signal TF (STF) generated by a process variation becomes easy.

Also, compensation for a parasitic capacitor formed in internal nodes of the second order LF may become simple. Thus, a second order LF that reduces power consumption and has a reduced area and enhanced performance is provided.

Figure 5:
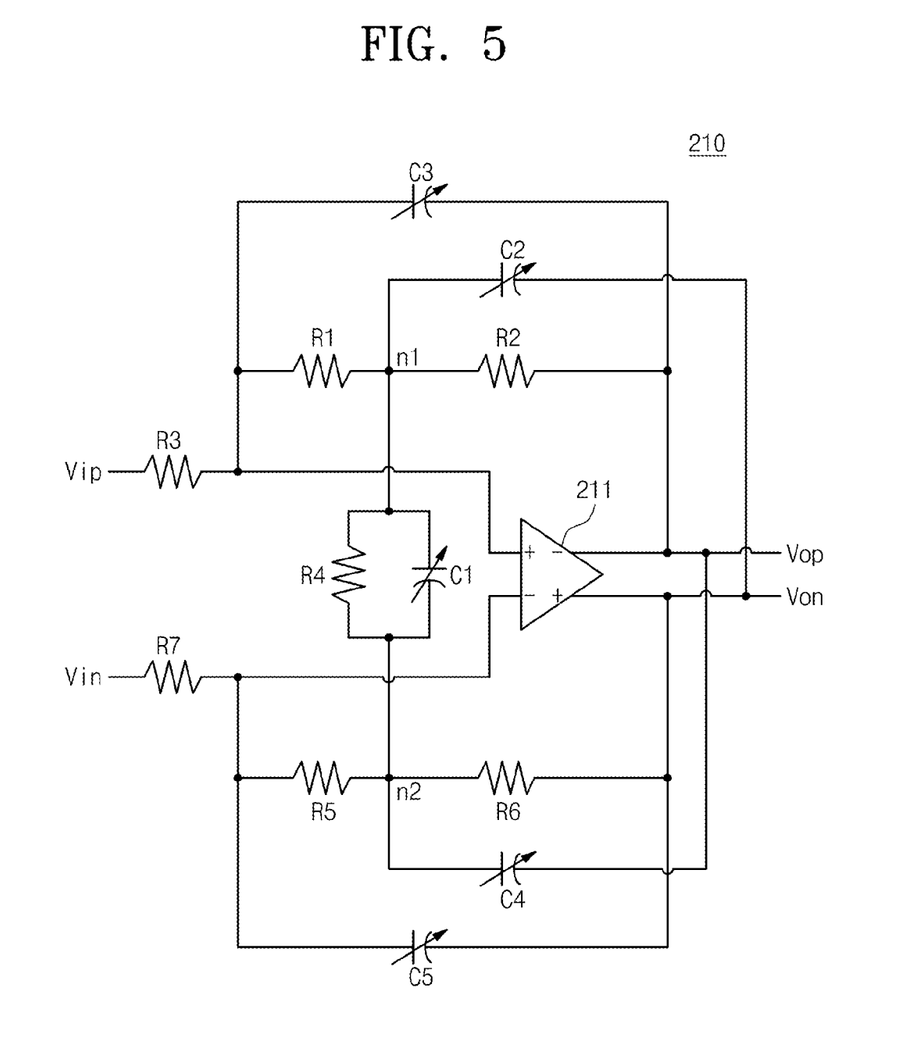
FIG. 5 is a circuit diagram of a second order LF according to another embodiment of the present invention.

FIG. 5 is a circuit diagram of a second order LF according to another embodiment of the present invention. As an example, a second order LF 210 provided as a fully differential circuit is described with reference to FIG. 5.

Referring to FIG. 5, the second order LF 210 includes first to seventh resistors R1 to R7, first to fifth capacitors C1 to C5, and an OTA 211.

One end of the first resistor R1 is connected to a first input of the OTA 211 and the other end thereof is connected to a first node n1. One end of the second resistor R2 is connected to the first output of the OTA 211 and the other end thereof is connected to the first node n1. One end of the third resistor R3 is connected to a first output of the OTA 211 and the other end thereof is connected to a first input voltage Vip. One end of the fourth resistor R4 is connected to the first node n1, and the other end thereof is connected to a second node n2. One end of the fifth resistor R5 is connected to the second node n2, and the other end thereof is connected to a second output of the OTA 211. One end of the sixth resistor R6 is connected to the second node n2, and the other end thereof is connected to the second output of the OTA 211. One end of the seventh resistor R7 is connected to a second input of the OTA 211 and the other end thereof is connected to a second input voltage Vin.

One end of the firth capacitor C1 is connected to the first node n1, and the other end thereof is connected to the second node n2. One end of the second capacitor C2 is connected to the first node n1, and the other end thereof is connected to the second output of the OTA 211. One end of the third capacitor C3 is connected to the first input of the OTA 211 and the other end thereof is connected to the first output of the OTA 211. One end of the fourth capacitor C4 is connected to the second node n2, and the other end thereof is connected to the first output of the OTA 211. One end of the fifth capacitor C5 is connected to the second input of the OTA 211 and the other end thereof is connected to the second output of the OTA 211.

As an example, the first and second input voltages Vip and Vin may be differential signals. The first and second inputs of the OTA 211 may be differential inputs. The first and second outputs of the OTA 211 may be differential outputs.

As an example, the second order LF 210 in FIG. 5 may be a circuit obtained by implementing the second order LF 110 in FIG. 4 as a fully differential circuit. Thus, the second order LF 210 in FIG. 5 may have the same operation as the second order LF 110 in FIG. 4.

Figure 6:
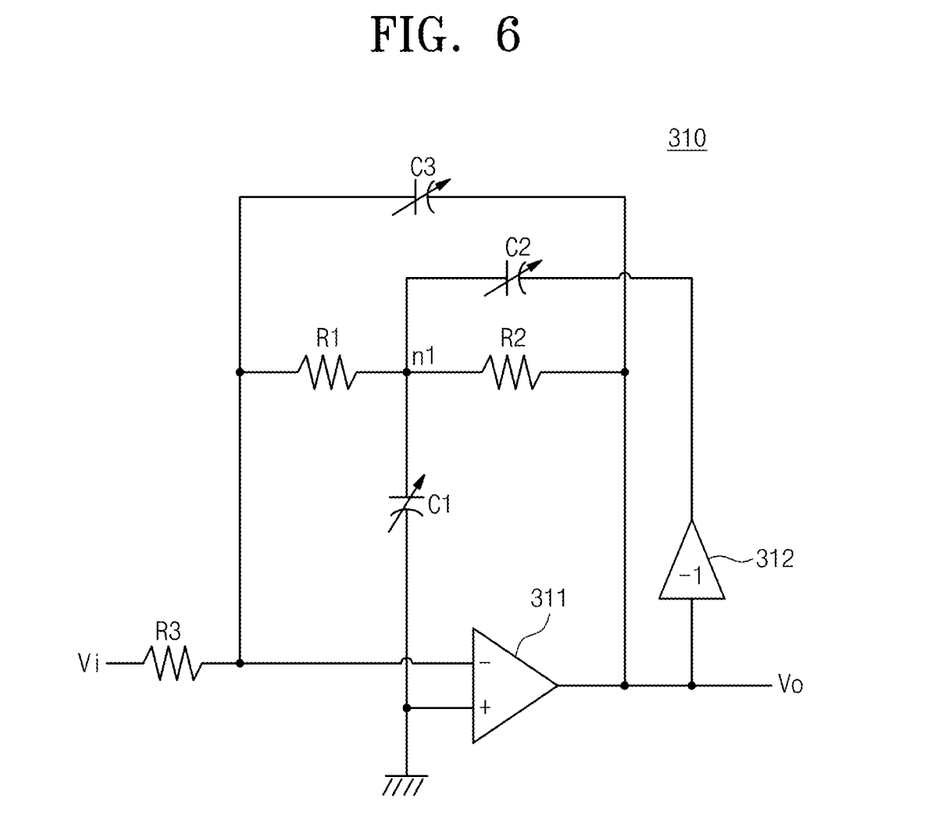
FIG. 6 is a circuit diagram of a second order LF according to still another embodiment of the present invention.

FIG. 6 is a circuit diagram of a second order LF according to still another embodiment of the present invention. Referring to FIG. 6, a second order LF 310 includes first to third resistors R1 to R3, first to third capacitors C1 to C3, an operational amplifier 311, and an inverter 312. Since the first to third resistors R1 to R3, first to third capacitors C1 to C3, operational amplifier 311, and the inverter 312 are described with reference to FIG. 4 above, their detailed descriptions are omitted.

The second order LF 310 in FIG. 6 does not include a fourth resistor R4, unlike the second order LF 110 in FIG. 4. However, the second order loop filter 310 may adjust the capacitance values of the first to third capacitors C1 to C3 to satisfy the operational condition of the second order LF 310, like the second order LF 110 in FIG. 4.

Table 1 exemplarily shows the element characteristics of the resistors and capacitors of the second order LF 110 in FIG. 4 and the second order LF 310 in FIG. 6. For simple description, the second order LF 110 including the fourth resistor R4 is called a "first LF 110" and the second order LF 310 not including the fourth resistor R4 is called a "second LF 310".

TABLE 1

| Element characteristics | First LF 110 | Second LF 310 |
| --- | --- | --- |
| C1 | 600 fF | 260 fF |
| C2 | 1.2 pF | 530 fF |
| C3 | 480 fF | 520 fF |
| R1 | 1.9 kΩ | 2.3 kΩ |
| R2 | 66.5 kΩ | 187 kΩ |
| R3 | 4.3 kΩ | 5.0 kΩ |
| R4 | 4.8 kΩ | — |

Referring to Table 1, the capacitance values of the capacitors of the first LF 110 are larger than those of the capacitors of the second LF 310. Also, the resistance of the second resistor R2 of the first loop filter 110 is smaller than that of the second resistor R2 of the second LF 310. As an example, the NTF of the second order LF may be represented by Equation (4):

$$NTF = \frac{1}{1 + (a_1/b_1)H(s)}. \tag{4}$$

Referring to Equation. 4, the NTF indicates the noise transfer function of the second order LF. Since remaining parameters are described above with reference to Equation 1, their descriptions are omitted. Referring to Equations 1 to 4, when the resistance of the second resistor R2 decreases, a change in NTF with respect to a change in the second resistor R2 may decrease. That is, it is easy to design the second order DSM by using the fourth resistor R4, like the first LF 110. However, the scope of the present invention is not limited thereto.

As an example, the characteristics of the resistor and capacitor elements in Table 1 are exemplary, and the scope of the present invention is not limited thereto. The characteristics of the resistor and capacitor elements in the second order LF may be controlled to satisfy the operational condition of the second order LF.

Figure 7:
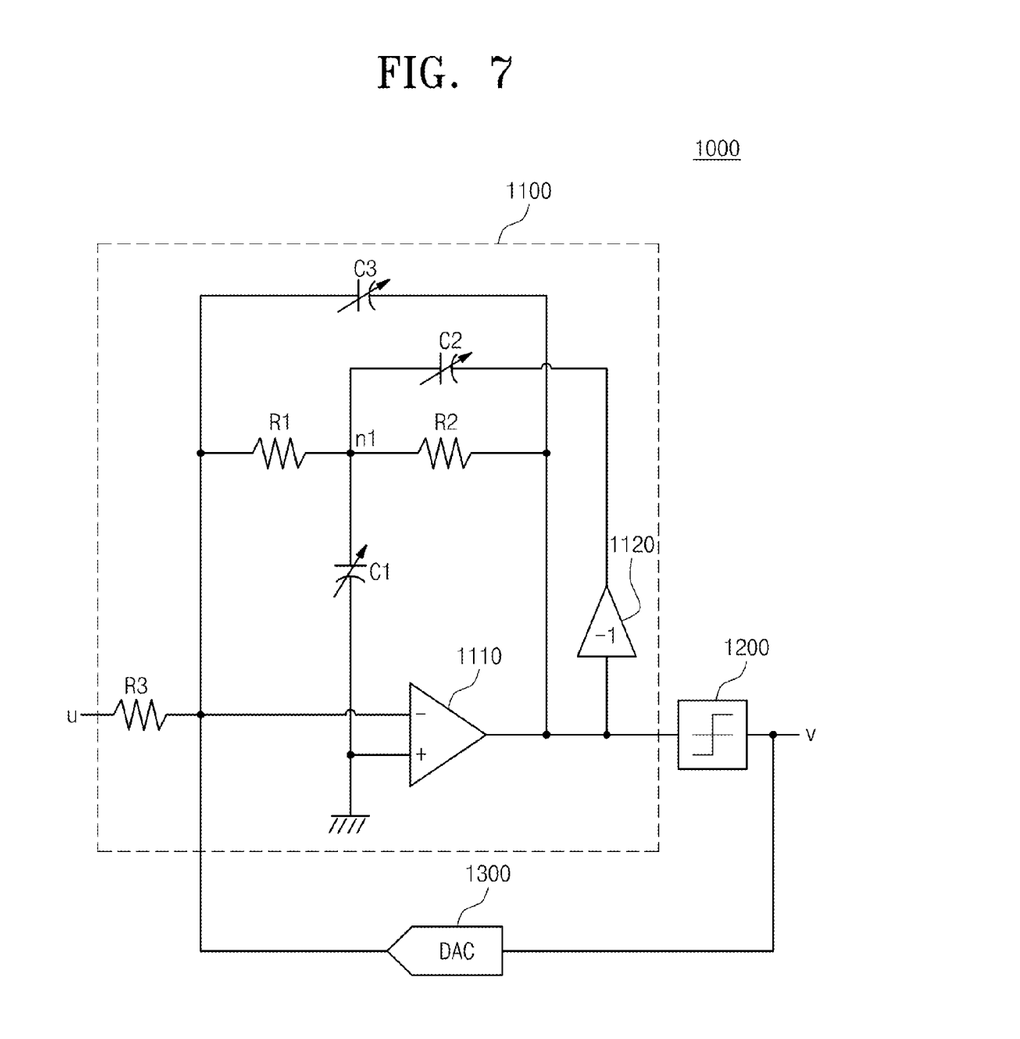
FIG. 7 is an exemplary circuit diagram of a second order DSM to which a second order LF according to still another embodiment of the present invention is applied.

FIG. 7 is an exemplary circuit diagram of a second order delta-sigma modulator (DSM) to which a second order LF according to still another embodiment of the present invention is applied. Referring to FIG. 7, a second order DSM 1000 includes a second order LF 1100, a quantizer 1200, and a digital to analog converter (DAC) 1300. The second order LF 1100 includes first to fourth resistors R1 to R4, first to third capacitors C1 to C3, an operational amplifier 1110, and an inverter 1120. Since the components of the second order LF 1100 are described above with reference to FIG. 4, their detailed descriptions are omitted.

The quantizer 1200 quantizes the output voltage of the second order LF 1100 to output an output signal SIG. The DAC 1300 may convert the output signal SIG into an analog signal.

The second order LF 1100 may output an output voltage Vo based on an input voltage Vi and a signal converted by the DAC 1300. As an example, the first and third capacitors C1 and C3 of the second order LF 1100 may be set to satisfy an operational condition, as described with reference to Equations 1 and 3. The second order LF 1100 performs the same operations as the first to third adders 11 to 13 and the first and second integrators 14 and 15 in FIG. 1.

Figure 8:
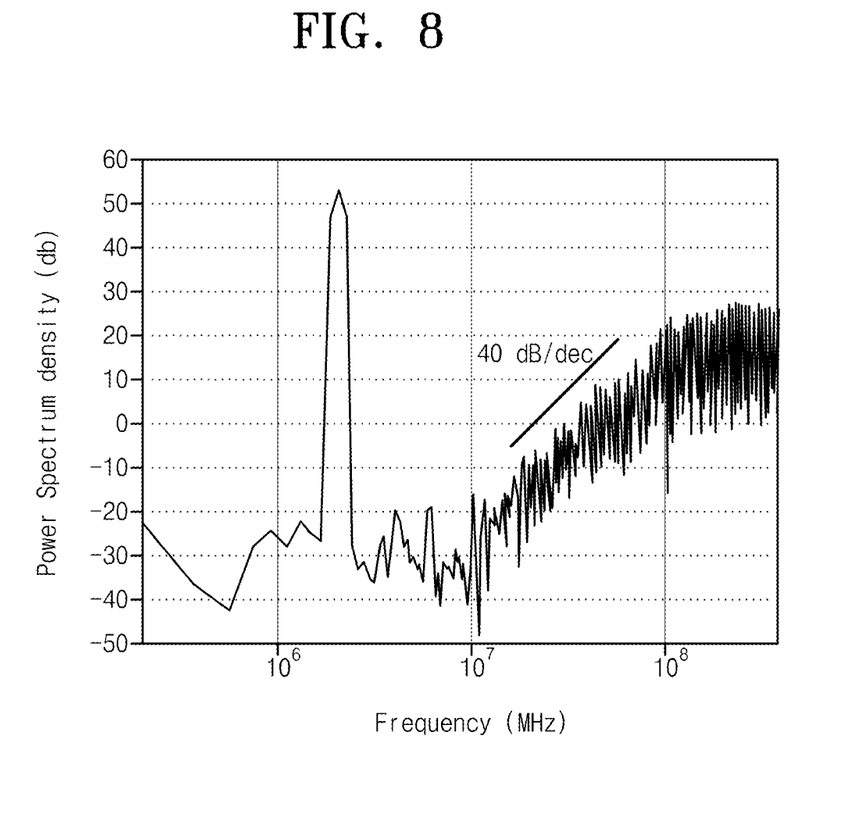
FIG. 8 is an exemplary graph of a spectrum of a signal output from the second order DSM in FIG. 7.

FIG. 8 is an exemplary graph of a spectrum of a signal output from the second order DSM in FIG. 7. In FIG. 8, the X axis of the graph indicates a frequency and the Y axis thereof indicates power spectrum density.

Referring to FIG. 8, the noise of a signal output from the second order DSM 1000 has a TF (or increase) of 40 dB/dec since a specific frequency section. It means that more noise is included in a frequency region larger than the frequency band of an output signal. That is, by moving noise to a frequency region higher than the frequency band of the output signal, noise included in the frequency band of the output signal decreases.

As an example, the NTF of a first order DSM may be about 20 dB/dec, the NTF of a second order DSM about 40 dB/dec, and the NTF of a third order DSM about 60 dB/dec.

The second order DSM to which the second order LF according to the present invention is applied performs the same operation as a typical second order DSM as described with reference to FIGS. 7 and 8, but has a simpler configuration than the typical second order DSM and reduces power consumption than that. Also, since the operational condition of the second order LF is controlled by controlling a plurality of capacitors, the present invention has a reduced element control range.

Figure 9:
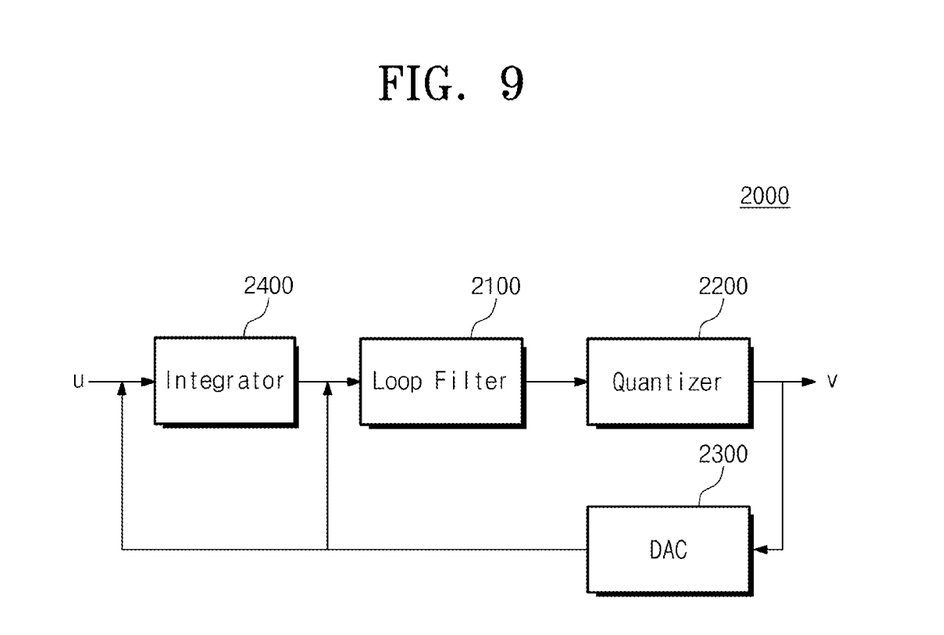
FIG. 9 is an exemplary circuit diagram of a multi-order DSM to which a second order LF according to still another embodiment of the present invention is applied.

FIG. 9 is an exemplary circuit diagram of a multi-order DSM to which a second order LF according to still another embodiment of the present invention is applied. As an example, it is assumed that the order of a multi-order DSM 2000 is third.

Referring to FIG. 9, the multi-order DSM 2000 may include an LF 2100, a quantizer 2200, a DAC 2300, and an integrator 2400.

The integrator 2400 may include an OTA, a resistor, and a capacitor. The integrator 2400 may integrate the difference between a signal output from the DAC 2300 and an input signal u to transmit a signal obtained through integration to the LF.

The LF 2100 may integrate the difference between a signal output from the integrator 2400 and a signal output from the DAC 2300 to transmit a signal obtained through integration to the quantizer 2200. As an example, the LF 2100 may be the second order LF as described with reference to FIGS. 3 to 6. That is, the LF 2100 may perform an operation corresponding to those of two integrators.

The quantizer 2200 may perform a quantization operation based on a signal output from the LF 2100 to output an output signal v.

As described above, the third order DSM 2000 may be implemented by using one integrator and one LF (i.e., second order LF according to the present invention). Thus, it is possible to provide the multi-order DSM 2000 that has a simple structure and reduces power consumption.

Figure 10:
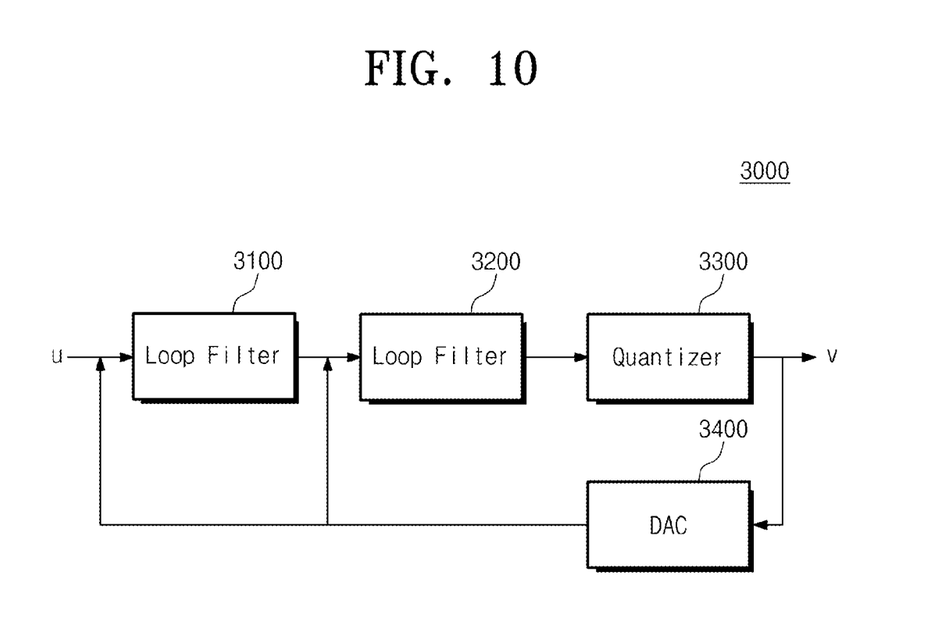
FIG. 10 is an exemplary circuit diagram of a multi-order DSM to which a second order LF according to still another embodiment of the present invention is applied.

FIG. 10 is an exemplary circuit diagram of a multi-order DSM to which a second order LF according to still another embodiment of the present invention is applied. As an example, it is assumed that a multi-order DSM 3000 in FIG. 9 is a fourth order DSM.

Referring to FIG. 10, the multi-order DSM 3000 includes first and second LFs 3100 and 3200, a quantizer 3300, and a DAC 3400. The first and second LFs 3100 and 3200 include a plurality of resistors and a plurality of capacitors, respectively. The first and second LFs 3100 and 3200 may be provided as any one of the second order LFs as described with reference to FIGS. 3 to 6, respectively. The first and second LFs 3100 and 3200 may be operate based on operation methods as described with reference to FIGS. 3 to 6.

A typical fourth order DSM has a structure in which four integrators are serially connected. However, the fourth order DSM according to the present invention may be implemented by using two second order LFs as shown in FIG. 9. Also, since it is possible to control the operational condition of the second order LF by controlling a plurality of capacitors, a multi-order DSM that reduces power consumption and has a reduced area is provided.

The technical spirit of the present invention is not limited to the multi-order DSMs in FIGS. 9 and 10. For example, the multi-order DSM may include a plurality of LFs. Alternatively, the multi-order DSM may further include an integrator. The plurality of LFs and integrators in the multi-order DSM may operate based on operation methods as described with reference to FIGS. 1 to 10.

Also, the multi-order DSM may further include an additional feedback loop in order to minimize the influence of an excess loop delay. Also, the multi-order DSM may include a plurality of feedback loops or feedforward loops in order to minimize the influences of pole and zero when the multi-order DSM is configured.

Figure 11:
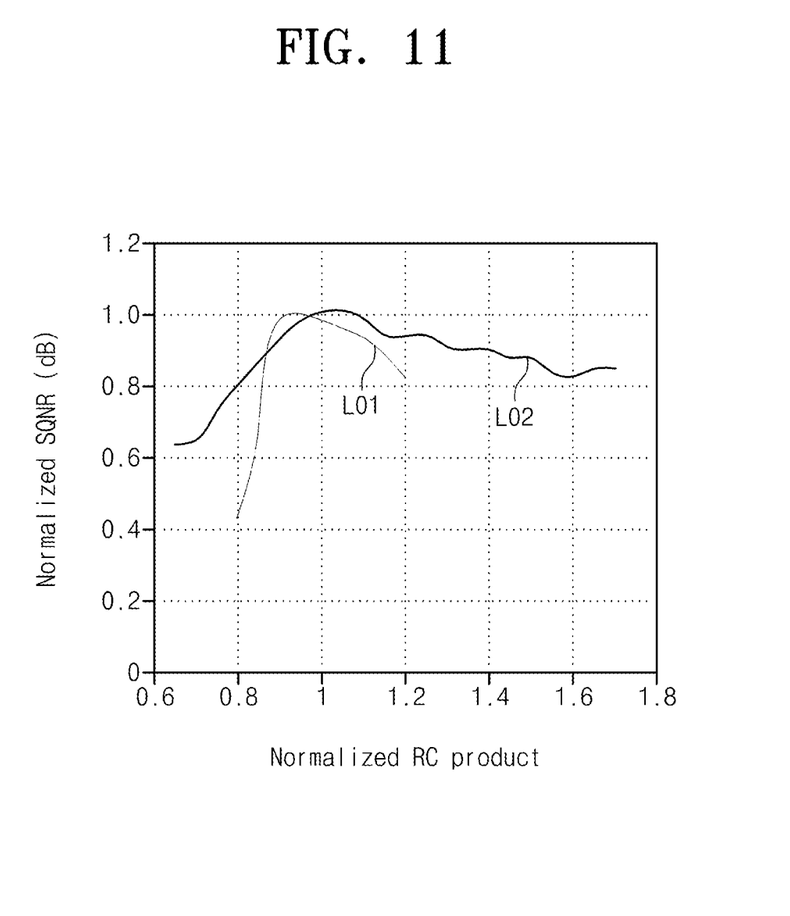
FIG. 11 is a graph for explaining the effect of a second order LF according to an embodiment of the present invention.

FIG. 11 is a graph for explaining the effect of a second order LF according to an embodiment of the present invention. As an example, the X axis in FIG. 11 indicates a normalized RC product and the Y axis indicates a normalized signal to quantization noise ratio (SQNR). Referring to FIG. 11, a first line L01 shows the relationship between the normalized RC product and a peak SQNR of an LF according to the related art. As shown on the first line L01, the LF according to the related art experiences a change of a wide range in peak SQNR with respect to a change of a narrow range in normalized RC product.

A second line L02 shows the relationship between the normalized RC product and a peak SQNR product of the second order LF according to the present invention. As shown on the second line L02, the second order LF according to the present invention experiences a change of a narrow range in peak SQNR product with respect to a change of a wide range in RC product. That is, since it is possible to operate the second order LF by controlling a plurality of capacitors, the second order LF according to the present invention easily performs control over a change in characteristics of the NTF and the STF generated by a process variation.

According to the embodiments of the present invention as described above, it is possible to provide the second order LF having a reduced element control range by controlling the operational condition of the second order LF through the control of a plurality of capacitors. Also, it is possible to provide the second order DSM by using the second order LF. Alternatively, it is possible to provide the multi-order DSM by using a plurality of second order LFs and a plurality of integrators. Thus, it is possible to provide the second order LF reducing power consumption and having a reduced area and the multi-order DSM including the second order LF.

According to the present invention, the second order DSM may be implemented by using one second order LF and one DAC.

Although the detailed description of the present invention has described particular embodiments, many variations may be implemented without departing from the scope of the present invention. Therefore, the scope of the present invention should not be limited to the above-described embodiments but be defined by the following claims and equivalents thereof.

What is claimed is:

1. A second order loop filter comprising:
    an operational amplifier comprising a first input, a second input for receiving a differential input of the first input, and an output;
    an inverter for inverting a signal output from the output of the operational amplifier, and outputting the inverted signal;
    a first resistor connected between the first input and a first node;
    a second resistor connected between the output of the operational amplifier and the first node;
    a third resistor connected between the first input and an input signal;
    a first capacitor connected between the second input and the first node;
    a second capacitor connected between the output of the operational amplifier and an output of the inverter; and
    a third capacitor connected between the output and the first input of the operational amplifier,
    wherein the second input is connected to a ground voltage.

2. The second order loop filter of claim 1, wherein the first to third capacitors comprise variable capacitors, or the first to third resistors comprise variable resistors.

3. The second order loop filter of claim 2, further comprising:
    a fourth resistor connected in parallel to the first capacitor.

4. The second order loop filter of claim 2, wherein capacitance values of the first to third capacitors are adjusted to configure the second order LF to perform a low pass filter operation.

5. The second order loop filter of claim 3, wherein the second or third capacitor is adjusted to configure a first order term of a denominator of a transfer function of the second order loop filter (LF) to be zero.

6. The second order loop filter of claim 2, wherein the operational amplifier comprises an operational transconductance amplifier (OTA).

7. The second order loop filter of claim 2, wherein the first capacitor is for adjusting a parasitic capacitance generated at the first node.

8. A second order loop filter comprising:
    an operational amplifier comprising a first input, a second input, a first output and a second output;
    a first resistor connected between the first input and a first node;
    a second resistor connected between the first output and the first node;
    a third resistor connected between the first input and a first input signal;
    a fourth resistor connected between the second input and a second node;
    a fifth resistor connected between the second output and the second node;
    a sixth resistor connected between the second input and a second input signal;
    a first capacitor connected between the first node and the second node;
    a second capacitor connected between the second output and the first node;
    a third capacitor connected between the first input and the first output;
    a fourth capacitor connected between the first output and the second node; and
    a fifth capacitor connected between the second input and the second output,
    wherein the first and second inputs comprise differential inputs, the first and second outputs comprise differential outputs, and the first and second input signals comprise differential input signals.

9. The second order loop filter of claim 8, wherein the first to fifth capacitors comprise variable capacitors, or the first to sixth resistors comprise variable resistors.

10. The second order loop filter of claim 9, further comprising:
    a seventh resistor connected in parallel to the first capacitor.

11. A multi-order delta-sigma modulator comprising:
    a second order loop filter (LF) for integrating a difference between an input signal and an analog signal, and outputting the integrated signal;
    a quantizer for quantizing a signal output from the second order LF, and outputting the quantized signal; and
    a digital to analog converter (DAC) for converting the signal output from the quantizer into an analog signal, and outputting the analog signal,
    wherein the second order LF comprises:
        an operational amplifier comprising a first input, a second input for receiving a differential input of the first input, and an output;
        an inverter for inverting a signal output from the output of the operational amplifier, and outputting the inverted signal;
        a first resistor connected between the first input and a first node;
        a second resistor connected between the output of the operational amplifier and the first node;
        a third resistor connected between the first input and an input signal;
        a first capacitor connected between the second input and the first node;

a second capacitor connected between the output of the operational amplifier and an output of the inverter; and a third capacitor connected between the output and the first input of the operational amplifier, wherein the second input is connected to a ground voltage.

12. The multi-order delta-sigma modulator (DSM) of claim 11, wherein the first to third capacitors comprise variable capacitors, or the first to third resistors comprise variable resistors.

13. The multi-order delta-sigma modulator (DSM) of claim 12, further comprising:

an integrator provided between the input signal and an input of the second order LF, wherein the integrator integrates a difference between the input signal and the analog signal, and transmits the integrated signal to the second order LF.

14. The multi-order delta-sigma modulator (DSM) of claim 12, further comprising:

n loop filters (LFs), wherein n is a natural number larger than zero, and wherein the n LFs and the second order LF are serially connected, and the multi-order DSM is for quantizing a final output signal from the n LFs and the second order LF that are serially connected, and outputting the quantized signal.

15. The multi-order delta-sigma modulator (DSM) of claim 12, wherein as the n increases, a size of a noise transfer function (NFT) of the multi order DSM increases step by step.

* * * * *